United States Patent
Nelson

(10) Patent No.: US 8,957,700 B2
(45) Date of Patent: Feb. 17, 2015

(54) APPARATUS AND METHODS FOR DIGITAL CONFIGURATION OF INTEGRATED CIRCUITS

(71) Applicant: Analog Devices, Inc., Norwood, MA (US)

(72) Inventor: Reuben P. Nelson, Colfax, NC (US)

(73) Assignee: Analog Devices, Inc., Norwood, MA (US)

( * ) Notice: Subject to any disclaimer, the term of this patent is extended or adjusted under 35 U.S.C. 154(b) by 194 days.

(21) Appl. No.: 13/631,505

(22) Filed: Sep. 28, 2012

(65) Prior Publication Data

US 2014/0091835 A1 Apr. 3, 2014

(51) Int. Cl.
*H03K 17/16* (2006.01)

(52) U.S. Cl.
USPC .................................. 326/30; 326/33; 326/58

(58) Field of Classification Search
CPC ... H04L 25/029; H04L 25/0292; H04L 25/03; H03K 19/09429
USPC ............... 326/21, 30–31, 33, 56–58
See application file for complete search history.

(56) References Cited

U.S. PATENT DOCUMENTS

| | | | |
|---|---|---|---|
| 8,022,723 B1 * | 9/2011 | Wang et al. ...................... | 326/30 |
| 8,446,169 B1 * | 5/2013 | Marlett et al. .................. | 326/30 |
| 2002/0057102 A1 * | 5/2002 | Kim ................................ | 326/30 |
| 2007/0103189 A1 * | 5/2007 | Chang et al. .................... | 326/30 |
| 2008/0303546 A1 * | 12/2008 | Millar ............................. | 326/30 |

OTHER PUBLICATIONS

Analog Devices, *1.6 GHz Clock Distribution IC, Dividers, Delay Adjust, Two Outputs*, AD9515 Data Sheet, 28 pages (Apr. 2012).
Analog Devices, *Dual Input Multiservice Line Card Adaptive Clock Translator*, AD9557 Data Sheet, 92 pages (Mar. 2012).

* cited by examiner

*Primary Examiner* — Jason M Crawford
(74) *Attorney, Agent, or Firm* — Knobbe, Martens, Olson & Bear, LLP

(57) ABSTRACT

Apparatus and method for digital configuration of integrated circuits (ICs) are provided herein. In certain implementations, an IC includes an impedance sensing circuit and at least one pin used for digital configuration. The impedance sensing circuit can detect an impedance value of an external passive network electrically connected to the pin, and can digitally configure the IC based on the detected impedance. For example, an end-user can connect an external resistor of a particular resistance to the pin, and the impedance sensing circuit can sense or detect the external resistor's resistance and digitally configure the IC based on the detected resistance. Accordingly, an end-user can digitally configure the IC by connecting a passive external component corresponding to a desired digital configuration to the pin. In certain implementations, the IC includes multiple pins, and the digital configuration is based on the impedances detected on each of the pins.

26 Claims, 6 Drawing Sheets

APPARATUS AND METHODS FOR DIGITAL CONFIGURATION OF INTEGRATED CIRCUITS

BACKGROUND

1. Field

Embodiments of the invention relate to electronic devices, and more particularly, to digital configuration of integrated circuits.

2. Description of the Related Technology

An integrated circuit (IC) can include one or more pins used to configure the IC. For example, the IC can include pins associated with a bus used for sequentially programming a state of the IC using, for instance, a microprocessor or an electrically erasable programmable read-only memory (EE-PROM). Alternatively, the pins can be selectively tied to power high or power low supply voltages to configure the IC binarily. In other implementations, the pins can be used to program the IC using analog techniques, such as by using resistor dividers and/or resistor-set (R-set) configurations.

Conventional IC configuration schemes can have a relatively large amount overhead and/or expense. For example, conventional IC configuration schemes can occupy a relatively large circuit area, have a relatively high degree of complexity, or use a relatively large number of pins for configuration. Accordingly, there is a need for improved configuration of ICs, including, for example, ICs that can be configured with reduced overhead and/or expense.

SUMMARY

In one embodiment, an integrated circuit (IC) includes a first pin and an impedance sensing circuit electrically connected to the first pin. The impedance sensing circuit is configured to determine an impedance of a first external passive network when the first external passive network is electrically connected to the first pin. The impedance sensing circuit is configured to digitally configure the IC to one of at least four possible states based on the determined impedance.

In another embodiment, a method of digitally configuring an IC is provided. The method includes determining an impedance of a first external passive network using an impedance sensing circuit of the IC and digitally configuring the IC to one of at least four possible states based on the determined impedance of the first external passive network. The first external passive network is electrically connected to a first pin of the IC, and the first external passive network is disposed external to the IC.

DETAILED DESCRIPTION OF CERTAIN EMBODIMENTS

Figure 1A:
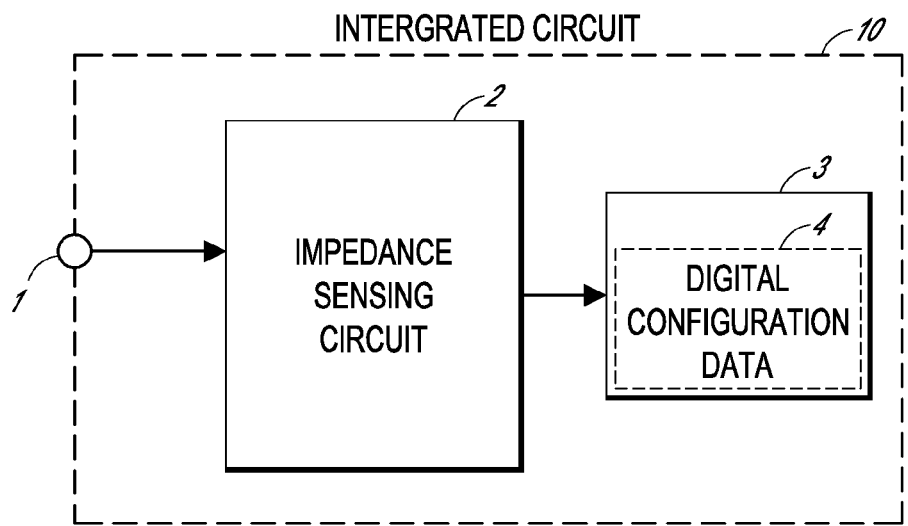
FIG. 1A is a schematic block diagram of one embodiment of an integrated circuit (IC).

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Overview of Integrated Circuits Including Passive Digital Configuration

An integrated circuit (IC) can include pins used for sequential programming of the device. For example, an IC can include a serial peripheral interface (SPI) used to program registers of the IC when the IC is initialized. Although sequential programming can allow a relatively large amount of digital configuration data to be provided to the IC using a relatively small number of pins, sequential programming can have a relatively large overhead that may be cost prohibitive for certain applications. Alternatively, an IC can include pins that are tied to a power high or power low supply voltage by a user to digitally configure the IC. For example, a pin can be connected to a power high supply voltage to indicate a logical "1" or connected to a power low supply voltage to indicate a logical "0", or vice versa. Although binary configuration can be effective in communicating a few bits of configuration data to an IC, such a configuration scheme can use a relatively large number of pins when the amount of digital configuration data is relatively large.

Apparatus and method for digital configuration of ICs are provided herein. In certain implementations, an IC includes an impedance sensing circuit and at least one pin used for digital configuration. The impedance sensing circuit can detect an impedance value of an external passive network electrically connected to the pin, and can digitally configure the IC to one of at least four possible states based on the detected impedance. For example, an end-user can connect an external resistor of a particular resistance to the pin, and the impedance sensing circuit can sense or detect the external resistor's resistance and digitally configure the IC based on the detected resistance. Accordingly, an end-user can digitally configure the IC by connecting an external passive network associated with a desired digital configuration to the pin. In certain implementations, the IC includes multiple pins used for configuration, and the impedance sensing circuit digitally configures the IC based on the impedance detected on each pin. Passive digital configuration of ICs can reduce the cost and/or overhead of digital configuration relative to sequential programming or binary configuration schemes.

In certain implementations the external passive network is connected between the pin and one of multiple reference voltages, and the impedance sensing circuit is further configured to determine which of the reference voltages the external passive network is connected to and to digitally configure the IC based on the determination. For example, the external passive network can include a first port or terminal connected to the pin and a second port or terminal electrically connected to one of the reference voltages. Configuring the impedance sensing circuit in this manner can further increase the amount of digital configuration data that can be determined from each pin.

FIG. 1A is a schematic block diagram of one embodiment of an IC 10. The IC 10 includes a pin 1, an impedance sensing circuit 2, and memory elements 3.

The memory elements 3 are used to store digital configuration data 4, which includes data corresponding to a digital state or configuration of the IC 10. For example, the digital configuration data 4 can be used to configure the IC 10 such that the operational behavior of the IC 10 is different depending on the state of the digital configuration data 4. In one embodiment, the digital configuration data 4 can be configured in at least four possible states, and in particular, to five or more possible states. The memory elements 3 can include registers, memory cells, flip-flops, latches, and/or any other suitable memory elements, including volatile and/or non-volatile storage devices.

The impedance sensing circuit 2 can be used to modify or change the digital configuration data 4 to one of the possible states based on an external passive network connected to the pin 1. For example, an end-user of the IC 10 can connect an external passive network of a particular impedance to the pin 1, and the impedance sensing circuit 2 can determine or detect the impedance of the external passive network. Additionally, the impedance sensing circuit 2 can change or set the digital configuration data 4 of the memory elements 3 based on the detected impedance. In certain implementations, the detected impedance of the external passive network is used to digitally configure the IC 10, but the operation of the IC 10 is otherwise unrelated to the impedance of the external passive network. As used herein, an external passive network can refer to a passive electronic circuit external to an IC that includes one or more resistors, inductors, and/or capacitors. In one embodiment, the external passive network includes at least one discrete resistor, discrete capacitor, or discrete inductor.

In certain implementations, the impedance sensing circuit 2 includes a resistance sensing circuit configured to determine the resistance of an external resistor that is electrically connected to the pin 1. For example, the impedance sensing circuit 2 can determine resistance by controlling a voltage across the resistor and measuring a current into or out of the external resistor, or by controlling a current into or out of the resistor and measuring a voltage across the resistor.

Although the impedance sensing circuit 2 can include a resistance sensing circuit in certain implementations, the teachings herein are also applicable to impedance sensing circuits that determine a capacitance of an external capacitor or that determine an inductance of an external inductor. Additionally, in certain implementations an impedance sensing circuit can determine a combined impedance of one or more resistors, capacitors, and/or inductors. In one embodiment, the impedance sensing circuit 2 is configured to determine a capacitance of a capacitor connected to the pin 1 based on generating a voltage signal on the pin 1 having a controlled rate of change and measuring a current into or out of the capacitor in response to the voltage signal. In another embodiment, the impedance sensing circuit 2 is configured to determine an inductance of an inductor connected to the pin 1 based on generating a current signal on the pin 1 having a controlled rate of change and measuring a voltage across the inductor in response to the current signal.

The impedance sensing circuit 2 can be configured to digitally configure the IC 10 at any suitable time. For example, the impedance sensing circuit 2 can digitally configure the IC 10 after activation of the IC's power supplies. In certain implementations, the impedance sensing circuit 2 can be configured to activate upon IC reset and/or at another designated time or condition.

In certain implementation, the pin 1 can be a dedicated configuration pin. In such implementations, the pin 1 can be non-operational after digital configuration of the IC 10. However, in other configurations, the pin 1 can be used operationally after digital configuration. For example, after the impedance sensing circuit 2 is used to sense the impedance of the external passive network connected to the pin 1, the pin 1 can be used for any purpose in which the external passive network does not interfere. For example, the pin 1 can be used for binary digital input/output signaling. In certain implementations, circuitry that drives or otherwise controls the voltage of the pin 1 is disabled while the IC 10 is being digitally configured.

Figure 1B:
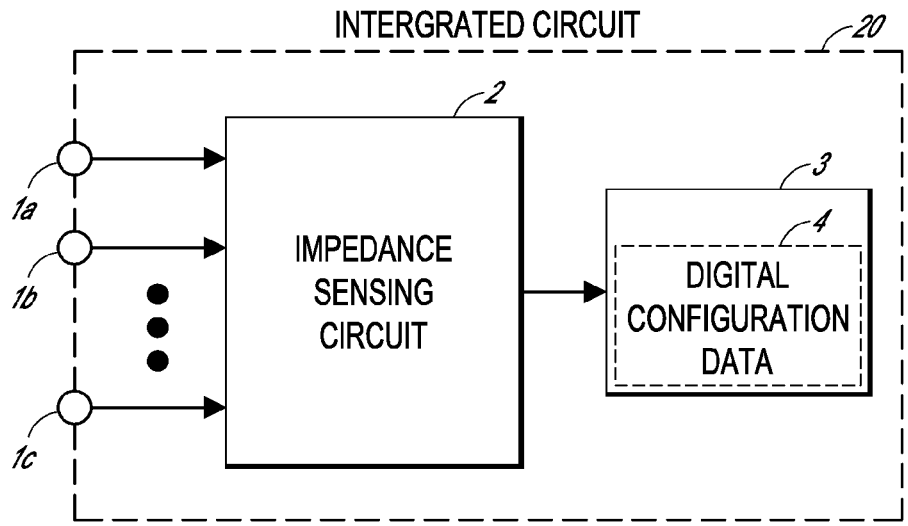
FIG. 1B is a schematic block diagram of another embodiment of an IC.

FIG. 1B is a schematic block diagram of another embodiment of an IC 20. The IC 20 includes first to third pins 1a-1c, the impedance sensing circuit 2, and the memory elements 3.

The IC 20 of FIG. 1B is similar to the IC 10 of FIG. 1A, except that the IC 20 illustrates an implementation including three pins. The impedance sensing circuit 2 can be used to detect an impedance connected to each of the first to third pins 1a-1c, and can digitally configure the IC 20 by changing the digital configuration data 4 based on the detected impedance values.

Although FIG. 1B illustrates a digital configuration scheme using three pins, the IC 20 can use more or fewer pins for digital configuration. Additionally, although the impedance sensing circuit 2 of FIG. 1B is configured to sense or determine the impedance of external passive networks connected to each of the first to third pins 1a-1c, the teachings herein are applicable to implementations in which multiple impedance sensing circuits are used, such as configurations in which each pin uses a separate impedance sensing circuit.

Figure 2A:
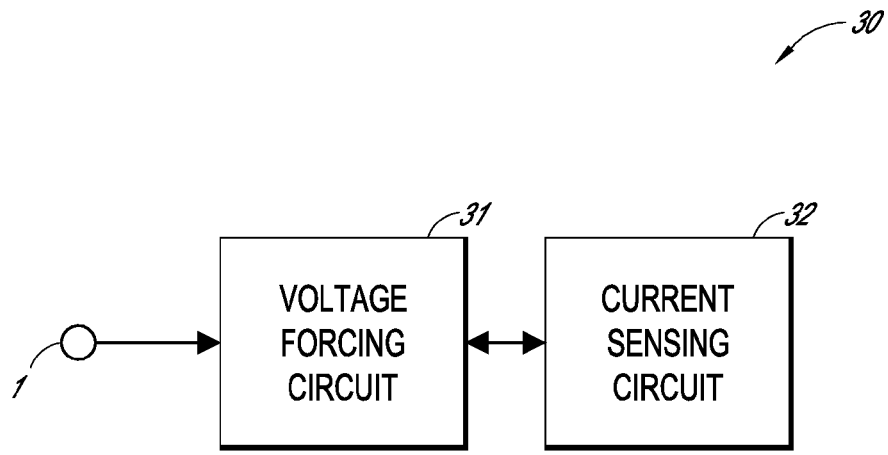
FIG. 2A is a schematic block diagram of one embodiment of a resistance sensing circuit.

FIG. 2A is a schematic block diagram of one embodiment of a resistance sensing circuit 30. The resistance sensing circuit 30 includes a voltage forcing circuit 31 and a current sensing circuit 32.

The resistance sensing circuit 30 illustrates one embodiment of the impedance sensing circuit 2 of FIGS. 1A and 1B. Although omitted from FIG. 2A for clarity, the resistance sensing circuit 30 and the pin 1 are included on an IC, such as the IC 10 of FIG. 1A. Thus, the resistance sensing circuit 30 is used to modify or set digital configuration data of an IC.

An external resistor can be connected between the pin 1 and a reference voltage, and the resistance sensing circuit 30 can detect the resistance of the external resistor and digitally configure the IC to one of at least four possible states based on the detected resistance. For example, in one embodiment an IC including the pin 1 and the resistance sensing circuit 30 is attached to a circuit board, and a discrete resistor of a particular resistance is attached to the circuit board and used to digitally configure the IC. In certain implementations, the circuit board including the IC and the external resistor can be encapsulated. Thus, in some configurations the external resistor is a discrete resistor having a resistance selected during manufacture of an electronic system to provide a desired digital configuration of the IC. By providing an IC that can be digitally configured in this manner, the IC can be used as a component in applications utilizing different IC digital configurations, while avoiding a need to manufacture multiple IC variations suitable for use with a particular system and/or avoiding the overhead and expense associated with conventional digital configuration schemes.

The voltage forcing circuit 31 can be used to control the voltage of the pin 1 to a forced or controlled voltage, and the current sensing circuit 32 can be used to measure or sense a current flowing into or out of the pin 1. Additionally, the measured or sensed current can be used to determine the external resistor's resistance based on Ohm's law. As will be described below, the resistance sensing circuit 30 can be used to digitally configure the IC to a digital configuration code associated with the detected resistance. In certain embodiments, the detected resistance is used to select a digital configuration code of the IC 10, but the operation of the IC 10 is otherwise unrelated to the resistance value of the external resistor.

A discrete resistor can have a nominal resistance value and a rated tolerance. For example, the International Electrotechnical Commission (IEC) 60063 standard defines values of resistors per decade based on their tolerance, including standard resistance values of E192, E96, E48, E24, E12, E6, and E3 series resistors having tolerances of 0.5%, 1%, 2%, 5%, 10%, 20%, and 40%, respectively. The values of the resistors in each E-series are defined by the IEC 60063 standard such that the error-bands of the resistors overlap by a relatively small amount. For example, for resistors in the E6 series having a 20% error tolerance, the resistor values of 10Ω, 15Ω, 22Ω, 33Ω, 47Ω, and 68Ω have error bands which cover or span one decade of resistance with a relatively small amount of overlap. The resistances defined in any E-series can be shifted to or applied to any decade of resistance by multiplying the value of each resistor in the E-series by $10^n$, where n is an integer.

Certain subsets of the resistors in an E series have non-overlapping error bands. For example, a subset of the E6 series associated with every other or every third resistor has non-overlapping error bands. Additionally, using a tighter tolerance resistor in a given E series can be used to provide a resistor set having non-overlapping error bands. For example, using 10% tolerance resistors in the E6 series can provide a set of resistors having non-overlapping error bands.

In certain implementations, a digital configuration of the IC is based on associating digital configuration codes with resistors values having non-overlapping error bands, such as the resistor values defined by a subset of those from the IEC 60063 standard and/or tighter tolerance resistors than those associated with a particular E series. The correspondence between resistor values and digital configuration codes can be provided to an end-user in a specification of the IC, and the end-user can program the IC by connecting a resistor of a particular resistance and tolerance to the pin. Since the error bands of the resistors in such a resistor coding scheme are non-overlapping, the resistance sensing circuit 30 can be used to detect the resistance of a resistor to determine a digital configuration code while preventing or reducing configuration errors associated with resistor variation.

Although various resistor coding schemes have been described above, the resistance sensing circuits described herein can be used with any suitable resistor coding scheme in which the resistors in the set have non-overlapping error bands. Using a resistor coding scheme with a gap or margin between the error bands can aid in preventing a digital configuration code from being incorrectly generated, such as when a resistance of an external resistor is outside of the resistor's rated tolerance due to ageing, stress, and/or variation due to temperature or humidity.

For purposes of illustration only, one implementation of a resistor coding scheme for the resistance sensing circuit 30 using E6 series resistor values with E12 tolerances is shown in Table 1 below.

TABLE 1

| Resistor Value | Digital Configuration |
|---|---|
| 100 Ω +/− 10% | 000 |
| 150 Ω +/− 10% | 010 |
| 220 Ω +/− 10% | 011 |
| 330 Ω +/− 10% | 100 |
| 470 Ω +/− 10% | 101 |
| 680 Ω +/− 10% | 110 |

In the configuration shown in Table 1, a selection of six resistor values of 10% or better tolerance external resistors can be used to provide six discrete logic values. Thus the illustrated resistance scheme can provide a significant improvement in information density relative to a binary coding scheme in which one of two logic states is conveyed by tying a pin high or low. Additionally, the pin can be configured to achieve higher information densities by expanding a number of resistor values that can be sensed by the resistance sensing circuit 30, such as by using tighter tolerance resistors and/or resistors spanning a wider range of resistance values, including resistance values that span multiple decades of resistance. Of course, other resistance values can be used and a different digital configuration can be selected. For example, rather than use 100Ω, 150Ω, etc., an alternative embodiment can use 100 kΩ, 150 kΩ, etc.

The illustrated resistance sensing circuit 30 can determine the resistance of the external resistor connected to the pin 1 by forcing a voltage across the resistor using the voltage forcing circuit 31 and sensing the resulting current using the current sensing circuit 32. Since the resistors can be configured to have non-overlapping error bands, the measured current can fall within a range of currents corresponding to a particular digital configuration code. In certain implementations, the resistance sensing circuit 30 is configured to compare the sensed current to one or more discrimination or threshold currents so as to determine which of the resistor values the sensed current corresponds to. In other implementations, the sensed current can be converted into a corresponding voltage and compared to one or more threshold voltages.

In one embodiment, the sensed current can be compared to one or more of the threshold currents so as to generate comparison data indicating whether the sensed current is lower than or higher than each of the threshold currents. In certain implementations, a binary search algorithm is used to identify between which two threshold currents, if any, the sensed current is between. In other implementations, the sensed current is compared sequentially to each current threshold, and the value of the digital configuration data is selected based on the results of the sequential comparisons. However, other configurations are possible, including, for example, hybrid implementations. One embodiment of a resistance sensing circuit using threshold currents is described further below with reference to FIG. 4. Although a comparison scheme using threshold currents has been described above, other threshold signals can be used. For example, the sensed current can be converted into a corresponding voltage and compared to one or more threshold voltages. Additionally, threshold signal comparison can also be used in other impedance sensing circuits described herein, including, for example, configurations using a current forcing circuit and a voltage measuring circuit, such as the resistance sensing circuit 40 of FIG. 2B described further below.

The voltage forcing circuit 31 can control the voltage of the pin 1 as well as a voltage of a first terminal of an external resistor connected to the pin 1. The second terminal of the external resistor can be connected by an end-user to a reference voltage, such as a power high supply voltage, a power low supply voltage, or another suitable DC voltage.

In certain implementations, an end-user can connect the second terminal of the external resistor to a reference voltage indicated by a specification of the IC. In such configurations, the current sensed by the current sensing circuit 32 can correspond to about $(V_{REF}-V_F)/R_{EXT}$, where $V_{REF}$ is the reference voltage, $V_F$ is the voltage generated by the voltage forcing circuit 31, and $R_{EXT}$ is the resistance of the external resistor.

However, in other implementations, an end-user can connect the second terminal of the external resistor to one of a plurality of reference voltages, and selection of the reference voltage can be detected and used to digitally program the IC. For example, the resistance sensing circuit 30 can be further configured to determine which of the reference voltages the second terminal of the external resistor is connected to, and to digitally configure the IC based on the result. For purposes of illustration only, another implementation of a resistor coding scheme for the resistance sensing circuit 30 is shown in Table 2 below. In contrast to the resistor coding scheme shown in Table 1, the resistor coding scheme shown in Table 2 includes digital configuration data based not only on the resistance of an external resistor connected to the pin 1, but also on whether the second terminal of the external resistor is connected to a first reference voltage $V_1$ or to a second reference voltage $V_2$.

TABLE 2

| Resistor Value | Reference Voltage | Digital Configuration |
|---|---|---|
| 100 Ω +/− 10% | $V_1$ | 0000 |
| 100 Ω +/− 10% | $V_2$ | 1000 |
| 150 Ω +/− 10% | $V_1$ | 0010 |
| 150 Ω +/− 10% | $V_2$ | 1010 |
| 220 Ω +/− 10% | $V_1$ | 0011 |
| 220 Ω +/− 10% | $V_2$ | 1011 |
| 330 Ω +/− 10% | $V_1$ | 0100 |
| 330 Ω +/− 10% | $V_2$ | 1100 |
| 470 Ω +/− 10% | $V_1$ | 0101 |
| 470 Ω +/− 10% | $V_2$ | 1101 |
| 680 Ω +/− 10% | $V_1$ | 0110 |
| 680 Ω +/− 10% | $V_2$ | 1110 |

In one embodiment using first and second reference voltages $V_1$, $V_2$, the forced voltage generated by the voltage forcing circuit 31 is selected to have a voltage level that is about halfway between the first and second reference voltages, or about equal to $(V_1+V_2)/2$. In such a configuration, the current sensing circuit 32 can be used to detect whether the external resistor is connected to the first or second reference voltage by determining a polarity of the sensed current.

The resistance sensing circuit 30 can also be configured to determine if the pin 1 is electrically floating. For example, the current sensing current 32 can be configured to detect a floating pin condition or state associated with a sensed current of about 0 A. In certain implementations, the floating pin condition is used to convey an additional value or state of the digital configuration. For example, in the configuration shown in Table 2 above, a floating pin condition can be selected to correspond to a digital configuration value of "1111". However, in other implementations the floating pin condition is used to determine an error state rather than a digital configuration value. For example, an error flag of the IC can be set when the floating pin condition is detected so as to indicate that the pin is floating. Configuring the IC in this manner can aid in detecting certain errors, such as errors associated with a misconnected external resistor and/or a misconnected reference voltage.

Although Table 2 illustrates a configuration using two reference voltages, the teachings herein are applicable to configuration using three or more reference voltages. Configuring the resistance sensing circuit 30 to detect several reference voltages can increase the amount of digital configuration data provided by each pin for a given number of resistor values.

Figure 2B:
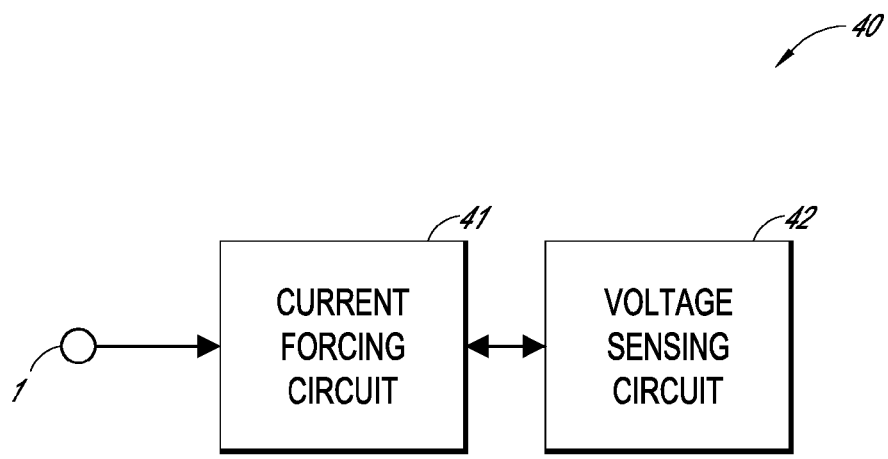
FIG. 2B is a schematic block diagram of another embodiment of a resistance sensing circuit.

FIG. 2B is a schematic block diagram of another embodiment of a resistance sensing circuit 40. The resistance sensing circuit 40 is coupled to the pin 1, and includes a current forcing circuit 41 and a voltage sensing circuit 42.

The resistance sensing circuit 40 of FIG. 2B can be similar to the resistance sensing circuit 30 of FIG. 2A, except that the resistance sensing circuit 40 of FIG. 2B senses resistance by forcing a current and measuring a voltage rather than by forcing a voltage and measuring a current. For example, the current forcing circuit 41 can be used to force a current into or out of the pin 1, and the voltage sensing circuit 42 can be used to measure a voltage of the pin 1. Additional details of the resistance sensing circuit 40 can be similar to those described earlier with respect to FIG. 2A.

Figure 3A:
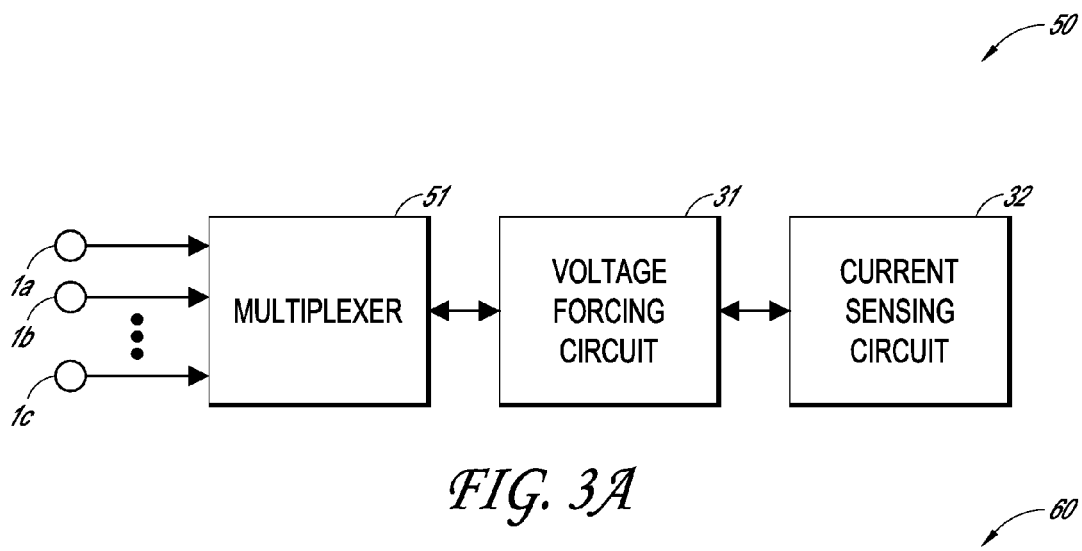
FIG. 3A is a schematic block diagram of another embodiment of a resistance sensing circuit.

FIG. 3A is a schematic block diagram of another embodiment of a resistance sensing circuit 50. The resistance sensing circuit 50 includes the voltage forcing circuit 31 and the current sensing circuit 32, which can be as described earlier with respect to FIG. 2A. Additionally, the resistance sensing circuit 50 further includes a multiplexer 51, which is electrically connected to a first pin 1a, a second pin 1b, and a third pin 1c.

The multiplexer 51 can be used to selectively connect the voltage forcing circuit 31 to the first pin 1a, to the second pin 1b, or to the third pin 1c. Including the multiplexer 51 allows the voltage forcing circuit 31 and the current sensing circuit 32 to sense the resistance of external resistors associated with multiple pins, thereby reducing overall circuit overhead. Although FIG. 3A illustrates a configuration using three pins, the multiplexer 51 can be adapted to multiplex between more or fewer pins.

Figure 3B:
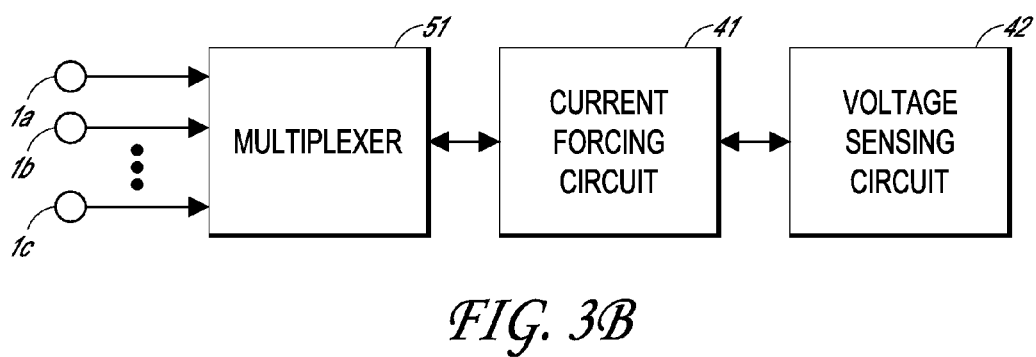
FIG. 3B is schematic block diagram of another embodiment of a resistance sensing circuit.

FIG. 3B is schematic block diagram of another embodiment of a resistance sensing circuit 60. The resistance sensing circuit 60 includes the current forcing circuit 41, the voltage sensing circuit 42, and the multiplexer 51. The multiplexer 51 can be used to selectively connect the current forcing circuit 41 to the first pin 1a, to the second pin 1b, or to the third pin 1c. Additional details of the resistance sensing circuit 60 can be similar to those described earlier.

Figure 3C:
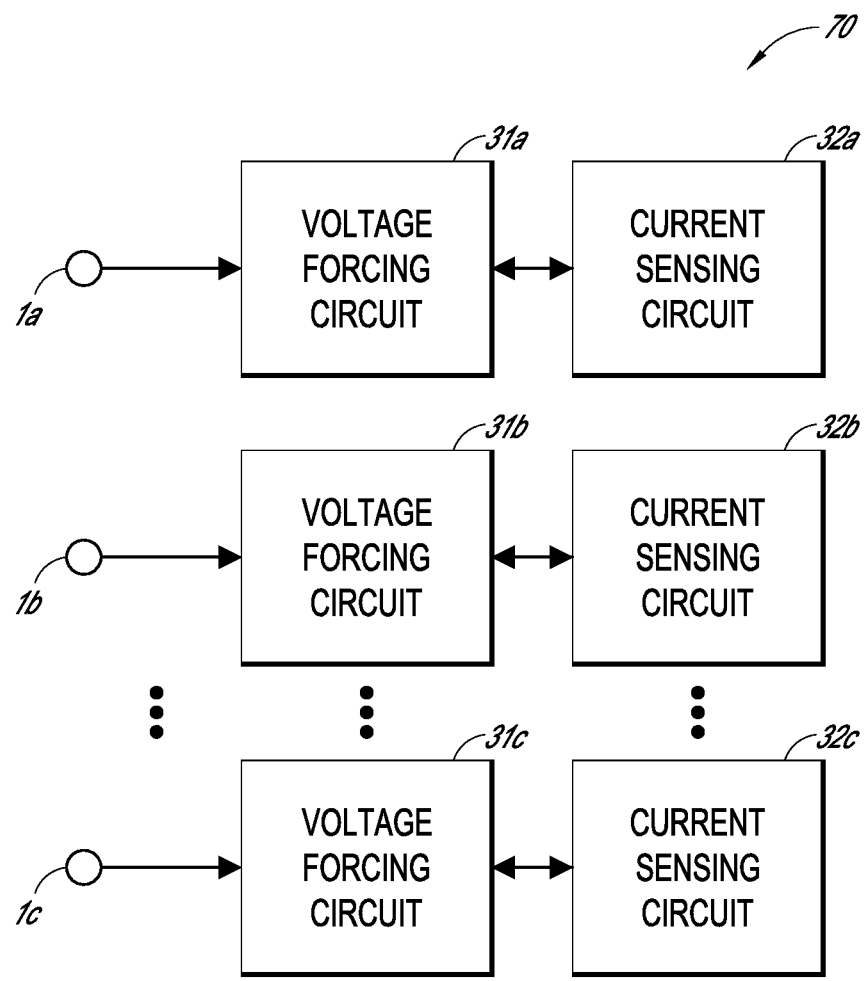
FIG. 3C is schematic block diagram of one embodiment of a digital configuration system including a plurality of resistance sensing circuits.

FIG. 3C is schematic block diagram of one embodiment of a digital configuration system 70 including a plurality of resistance sensing circuits. The digital configuration system 70 includes first to third current sensing circuits 32a-32c and first to third voltage forcing circuits 31a-31c, which have been electrically connected to first to third pins 1a-1c, respectively. The illustrated digital configuration system 80 illustrates one example of a configuration in which separate resistance sensing circuits have been used for each of the first to third pins 1a-1c. Additional details of the digital configuration system 80 can be similar to those described earlier.

Figure 3D:
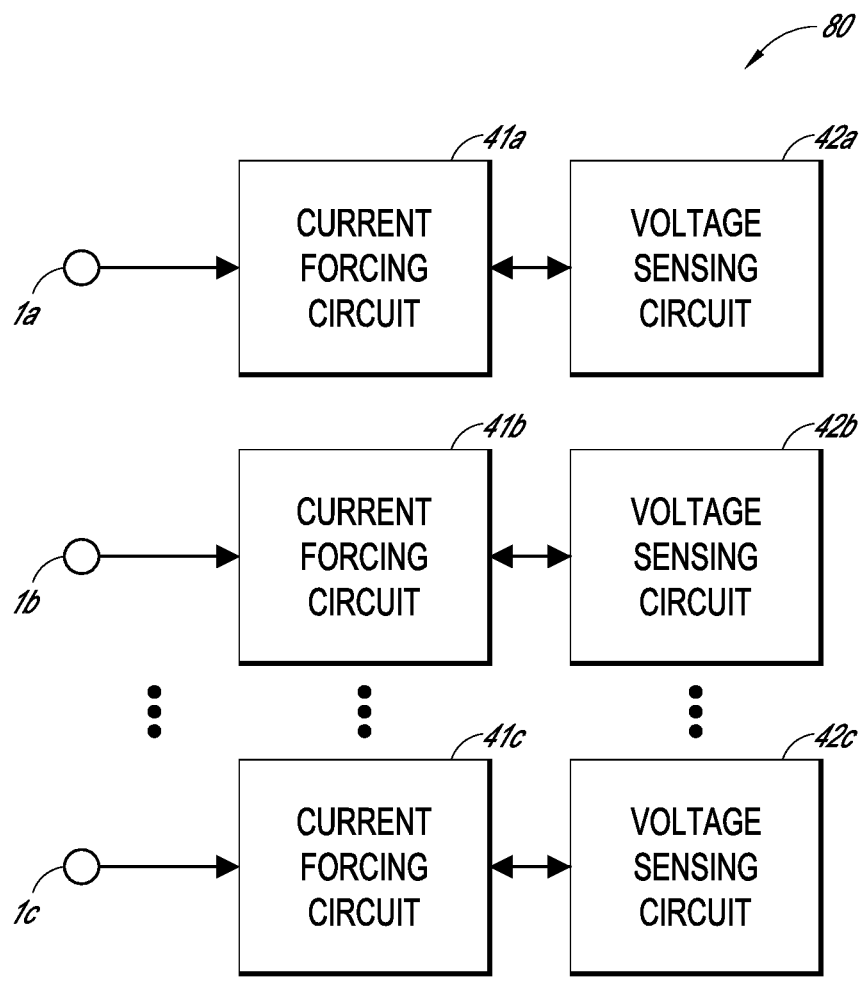
FIG. 3D is schematic block diagram of another embodiment of a digital configuration system including a plurality of resistance sensing circuits.

FIG. 3D is schematic block diagram of another embodiment of a digital configuration system 80 including a plurality of resistance sensing circuits. The digital configuration system 80 includes first to third voltage sensing circuits 42a-42c and first to third current forcing circuits 41a-41c, which have been electrically connected to first to third pins 1a-1c, respectively. The illustrated digital configuration system 80 illustrates one example of a configuration in which separate resistance sensing circuits have been used for each of the first to third pins 1a-1c. Additional details of the digital configuration system 80 can be similar to those described earlier.

Figure 4:
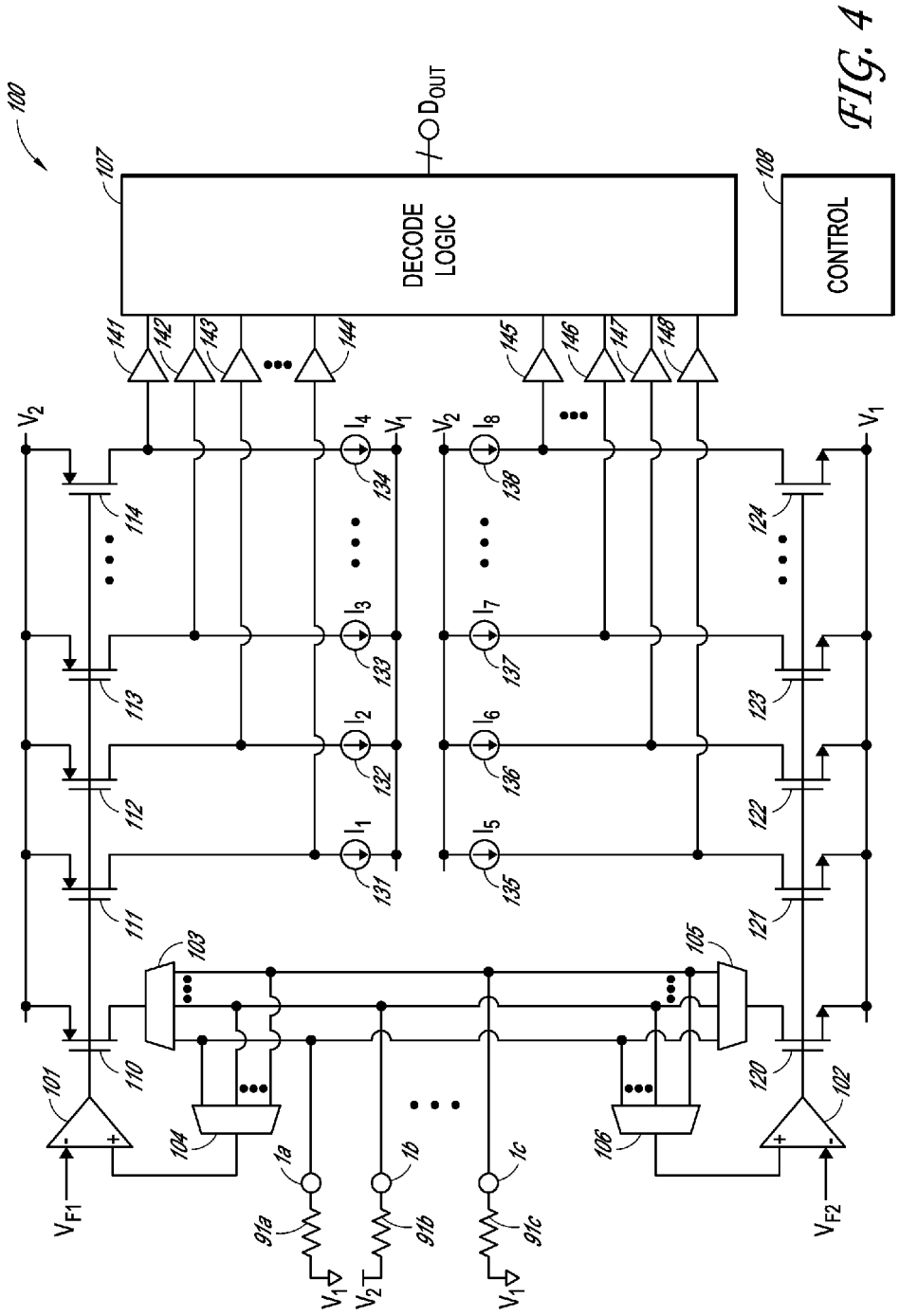
FIG. 4 is a circuit diagram of a resistance sensing circuit according to one embodiment.

FIG. 4 is a circuit diagram of a resistance sensing circuit 100 according to one embodiment. The resistance sensing circuit 100 includes a first amplifier 101, a second amplifier 102, a first multiplexer 103, a second multiplexer 104, a third multiplexer 105, a fourth multiplexer 106, decode logic 107, a control block 108, a PMOS current-sensing transistor 110, first to fourth PMOS mirror transistors 111-114, an NMOS current-sensing transistor 120, first to fourth NMOS mirror transistors 121-124, first to eighth currents sources 131-138, and first to eighth comparators 141-148.

The resistance sensing circuit 100 is electrically connected to the first to third pins 1a-1c. The resistance sensing circuit 100 has been annotated to include one possible configuration of external resistors connected to the pins. For example, a first external resistor 91a has been electrically connected between the first pin 1a and a power low supply voltage $V_1$, a second external resistor 91b has been electrically connected between the second pin 1b and a power high supply voltage $V_2$, and a third external resistor 91c has been electrically connected between the third pin 1c and the power low supply voltage $V_1$. Although the resistance sensing circuit 100 is illustrated as sensing the resistances of external resistors connected to three pins, the resistance sensing circuit 100 can be used to sense resistors associated with more or fewer pins.

The first and second multiplexers 103, 104 each include first to third inputs coupled to the first to third pins 1a-1c, respectively. The first multiplexer 103 further includes an output coupled to a drain of the PMOS current-sensing transistor 110, and the second multiplexer 104 further includes an output electrically connected to a non-inverting input of the first amplifier 101. The first amplifier 101 further includes an inverting input electrically connected to a first forcing voltage $V_{F1}$ and an output electrically connected to a gate of the PMOS current-sensing transistor 110 and to a gate of each of the first to fourth PMOS mirror transistors 111-114. In the illustrated configuration, the PMOS current-sensing transistor 110 and the first to fourth PMOS mirror transistors 111-114 each further include a source electrically connected to the power high supply voltage $V_2$. However, other implementations are possible, such as implementations using other configurations of current mirrors, such as those including cascoded devices. The first to fourth PMOS mirror transistors 111-114 each further include a drain electrically connected to an input of the first to fourth comparators 141-144, respectively. In the configuration shown in FIG. 4, the first to fourth current sources 131-134 are electrically connected between the power low supply voltage $V_1$ and the drain of the first to fourth PMOS mirror transistors 111-114, respectively. However, the current sources can be connected in other ways. The decode logic 107 includes first to fourth inputs electrically connected to an output of the first to fourth comparators 141-144, respectively.

The third and fourth multiplexers 105, 106 each include first to third inputs coupled to the first to third pins 1a-1c, respectively. The third multiplexer 105 further includes an output coupled to a drain of the NMOS current-sensing transistor 120, and the fourth multiplexer 106 further includes an output electrically connected to a non-inverting input of the second amplifier 102. The second amplifier 102 further includes an inverting input electrically connected to a second forcing voltage $V_{F2}$ and an output electrically connected to a gate of the NMOS current-sensing transistor 120 and to a gate of each of the first to fourth NMOS mirror transistors 121-124. In the illustrated configuration, the NMOS current-sensing transistor 120 and the first to fourth NMOS mirror transistors 121-124 each further include a source electrically connected to the power low supply voltage $V_1$. However, other implementations are possible, such as implementations using other configurations of current mirrors, such as those including cascoded devices. The first to fourth NMOS mirror transistors 121-124 each further include a drain electrically connected to an input of the fifth to eighth comparators 145-148, respectively. In the configuration shown in FIG. 4, the fifth to eighth current sources 135-138 are electrically connected between the power high supply voltage $V_2$ and the drain of the first to fourth NMOS mirror transistors 121-124, respectively. However, the current sources can be connected in other ways. The decode logic 107 further includes fifth to eighth inputs electrically connected to an output of the fifth to eighth comparators 145-148, respectively. The decode logic 107 further includes an output configured to generate a digital output signal $D_{OUT}$, which can be used to provide digital configuration data to memory elements of an IC.

Although not illustrated in FIG. 4 for clarity, the control block 108 can be used to generate control signals for controlling the first to fourth multiplexers 103-106. For example, the control block 108 can be used to control which of the pins is selected by the multiplexers. Additionally, in certain implementations, the control block 108 can be used to control the operation of the decode logic 107, such as by capturing comparison data generated by the first to eighth comparators 141-148 into latches or flip-flops of the decode logic 107.

The illustrated resistor sensing circuit 100 can be used detect a resistance value of the first to third external resistors 91a-91c connected to the first to third pins 1a-1c as well as to detect whether each of the external resistors is connected to the power high supply voltage $V_2$ or to the power low supply voltage $V_1$.

For example, the first and second multiplexers 103, 104 can be used to connect one of the first to third pins 1a-1c to the non-inverting input of the first amplifier 101 and to the drain of the PMOS current-sensing transistor 110. When the external resistor associated with the selected pin is connected between the pin and the power low supply voltage $V_1$, the first amplifier 101 can control the voltage of the pin via feedback to a forcing voltage that is about equal to the first forcing voltage $V_{F1}$. Additionally, the flow of current into the external resistor can be about equal to a sensed current through the PMOS current-sensing transistor 110, and the sensed current can be mirrored using the first to fourth PMOS mirror transistors 111-114. The mirrored currents can be compared to the first to fourth threshold currents $I_1$-$I_4$ generated by the first to fourth current sources 131-134, respectively. The output or comparison data generated by the first to fourth comparators 141-144 can indicate whether the sensed current through the PMOS current-sensing transistor 110 is greater than or less than each of the first to fourth threshold currents $I_1$-$I_4$. Thus, when the external resistor is connected between the pin and the power low supply voltage $V_1$, the PMOS current-sensing transistor 110 and associated circuitry can be used to generate current threshold comparison data for the decode logic 107.

However, when the external resistor is connected between the pin and the power high supply voltage $V_2$, the source-to-drain voltage of the PMOS current-sensing transistor 110 can be about 0V. Thus, the current sensed by the PMOS current-sensing transistor 110 can be about 0 A, and the comparison data generated by the first to fourth comparators 141-144 can indicate that no current was detected.

Similarly, the third and fourth multiplexers 105, 106 can be used to connect one of the first to third pins 1a-1c to the non-inverting input of the second amplifier 102 and to the drain of the NMOS current-sensing transistor 120. When the external resistor associated with the selected pin is connected between the pin and the power high supply voltage $V_2$, the second amplifier 102 can control the voltage of the pin to a forcing voltage that is about equal to the second forcing voltage $V_{F2}$. Additionally, a sensed current through the NMOS current-sensing transistor 120 can be mirrored using the first to fourth NMOS mirror transistors 121-124, and thereafter compared to the fifth to eighth threshold currents $I_5$-$I_8$ generated by the fifth to eighth current sources 135-138, respectively. The fifth to eight comparators 145-148 can generate comparison data indicating whether the sensed current is greater than or less than each of the fifth to eighth threshold currents $I_5$-$I_8$. Thus, when the external resistor is connected between the pin and the power high supply voltage $V_2$, the NMOS current-sensing transistor 120 and associated circuitry can be used to sense the current through the external resistor and provide current threshold comparison data to the decode logic 107. However, when the external resistor is connected between the pin and the power low supply voltage $V_1$, the current through the NMOS current-sensing transistor 120 can be about 0 A and the comparison data generated by the fifth to eighth comparators 145-148 can indicate that no current was detected.

Accordingly, the resistance sensing circuit 100 can be used detect a resistance value of the first to third external resistors 91a-91c as well as to detect whether each of the external resistors is connected to the power high supply voltage $V_2$ or to the power low supply voltage $V_1$. The decode logic 107 can be any suitable logic for decoding the comparison data generated by the first to eighth comparators 141-148 into a digital output signal $D_{OUT}$ corresponding to the digital configuration data to be stored in the IC. For example, in certain implementations, the decode logic 107 includes a first thermometer decoder circuit for generating a first portion of the bits of the digital output signal $D_{OUT}$ by decoding the output of the first to fourth comparators 141-144 and a second thermometer decoder circuit for generating a second portion of the bits of the digital output signal $D_{OUT}$ by decoding the output of the fifth to eighth comparators 145-148. However, other configurations of the decode logic 107 can be used. Furthermore, in one embodiment the decode logic 107 includes storage elements such as flip-flops or latches used to capture the comparison data generated by the first to eighth comparators 141-148.

The illustrated configuration uses a scheme in which the PMOS current-sensing transistor 110 sources current, while the NMOS current-sensing transistor 120 sinks current. Configuring the resistance sensing circuit 100 in this manner can aid in detecting whether the external resistor is connected to a power high or power low supply voltage, since the PMOS current-sensing transistor 110 can be cutoff when the external resistor is connected to the power high supply voltage and the NMOS current-sensing transistor 120 can be cutoff when the external resistor is connected to the power low supply voltage. In certain implementations, a current sourcing subcircuit and a current sinking subcircuit are configured to sense a resistance of a pin sequentially, and testing is halted once one of the subcircuits senses a non-zero pin current.

The resistance sensing circuit 100 of FIG. 4 illustrates a configuration in which the power high and power low supply voltages $V_2$, $V_1$ are used both as reference voltages for the external resistors 91a-91c and as power supplies for the PMOS current-sensing transistor 110 and the NMOS current-sensing transistor 120. However, other configurations are possible. For example, in one embodiment the PMOS current-sensing transistor 110 is powered using an internal power high supply voltage and the NMOS current-sensing transistor 120 is powered using an internal power low supply voltage, while the external resistors are configured to use external power high and external power low supply voltages as reference voltages. In another embodiment, the power high supply voltage used to power the PMOS current-sensing transistor 110 is sufficiently large to detect a current through an external resistor when the external resistor is connected to a first reference voltage, but a difference between the power high supply voltage and a second reference voltage is small enough such that any current sensed by the PMOS current-sensing transistor 110 is less than the smallest threshold current. Similarly, the power low supply voltage used to power the NMOS current-sensing transistor 120 can be sufficiently small to detect a current through an external resistor when the external resistor is connected to the second reference voltage, but a difference between the first reference voltage and the power low supply voltage can be small enough that any current sensed by the NMOS current-sensing transistor 120 is less than the smallest threshold current. For example, the comparators of the resistance sensing circuit can detect no current whenever the sensed current is smaller than the smallest threshold current, and thus a sensed current less than the smallest threshold current can be substantially indistinguishable from no current being sensed.

The resistance sensing circuit 100 can also be used to determine a floating pin condition, such as when an external resistor is not connected to a reference voltage. For example, the floating pin condition can be associated with no current being sensed or a current less than the smallest threshold being sensed by both the PMOS current-sensing transistor 110 and by the NMOS current-sensing transistor 120. In certain configurations, the floating pin condition can correspond to an additional digital configuration state. In other configurations, the floating pin condition is flagged as an error.

In one embodiment, threshold currents, such as the first to eighth threshold currents $I_1$-$I_8$ of FIG. 4, can be generated by using ratio-metric scaling. For example, a reference resistor (not illustrated in FIG. 4) can be used to generate a reference current of a particular value by forcing a controlled voltage across the reference resistor, such as a bandgap voltage or a fraction thereof. Additionally, the reference current can be mirrored using replica transistors to generate threshold currents of desired values. Since variation in the reference current can determine a lower bound on how closely spaced resistance values of the external resistors can be selected in a resistor coding scheme, in certain implementations, the reference current can be generated using a high-precision reference resistor. For example, in one embodiment the reference current is generated using a tight-tolerance external reference resistor, while in another embodiment the reference resistor is fabricated on the IC but trimmed or otherwise calibrated to reduce resistance variation. Although certain embodiments use a high-precision reference resistor, in some configurations a high-precision reference resistor need not be used. For example, in configurations in which fabrication variation is tolerable, the reference resistor can be fabricated on the IC and need not be trimmed or calibrated.

In certain configurations using an external precision reference resistor, the value of the external precision reference resistor is a fixed value, such as a fixed resistance associated with a specification of the IC. However, in other configurations, the external precision reference resistor can be selected by an end-user to be a reference resistance selected from a set of reference resistor values. Additionally, a resistance sensing circuit can use an internal reference resistor of a lower precision to determine the resistance of the external precision reference resistor. After the resistance sensing circuit determines the resistance of the external precision reference resistor, the resistance sensing circuit can use the external precision reference resistor to generate threshold signals used for resistance detection. Additionally, the detected reference resistance can be used for digitally configuring the IC. Accordingly, after initial detection of a resistance of a high-precision external resistor, the external resistor can be used to perform more precise resistance detection of external resistors connected to other IC pins. In certain embodiments, the external precision reference resistor can also be connected by an end-user to one of a plurality of reference voltages, and an impedance sensing circuit can be used to determine which of the reference voltages the external precision reference resistor is connected to and to digitally configure the IC based on the detected reference voltage.

In certain implementations, the number and/or magnitude of the threshold currents included in the resistance sensing circuit 100 can be selected based on a resistor coding scheme. For example, each resistance value used in the coding scheme can have a corresponding nominal current value, and the threshold currents can be positioned between the nominal current values so as to discriminate between the possible resistances. Accordingly, although FIG. 4 illustrates one possible configuration of threshold currents, the resistance sensing circuit 100 can be adapted to include more or fewer threshold currents. In one embodiment, the first to fourth threshold currents $I_1$-$I_4$ are configured to have equal magnitude but opposite polarity of the fifth to eighth threshold currents $I_5$-$I_8$.

The first and second forced voltages $V_{F1}$, $V_{F2}$ can have any suitable voltage level. In one embodiment, the first and second forced voltages $V_{F1}$, $V_{F2}$ are configured to have a voltage level that is about equal, and the voltage level of the first and second forced voltages $V_{F1}$, $V_{F2}$ is selected to be about equal to a voltage level halfway between the power high and power low supply voltages $V_1$, $V_2$. However, other configurations are possible, including, for example asymmetric configurations. In one embodiment, the first and second forced voltages $V_{F1}$, $V_{F2}$ are generated based on a bandgap reference voltage.

Although FIG. 4 illustrates a resistance sensing circuit that uses two reference voltages, resistance sensing circuits can be provided that determine more than two reference voltages. For example, in one embodiment, the reference voltage is determined by measuring a voltage of the pin when a voltage forcing circuit is disabled. In another embodiment, a pin is sequentially forced to two or more forced voltages and measured currents are determined for each forced voltage. Additionally, a slope of a line between the current and voltage points (I, V) is measured to determine resistance, and a voltage zero-crossing is determined based on the current and voltage points to determine the reference voltage. Although two examples of determining the voltage level of three or more reference voltages have been described, other configuration can be used.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, medical electronic products, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. The medical electronic products can include, but are not limited to, a Digital-X-ray detector, a CT (Computed Tomography) scanner, an Ultrasounds system, a MRI (Magnetic Resonance Imaging) system, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An integrated circuit (IC), comprising:
a first pin; and
an impedance sensing circuit electrically connected to the first pin, wherein the impedance sensing circuit is configured to determine an impedance of a first external passive network when the first external passive network is electrically connected to the first pin, and wherein the impedance sensing circuit is configured to digitally configure the IC to one of at least four possible states based on the determined impedance.

2. The IC of claim 1, wherein the first external passive network includes a first external resistor, and wherein the impedance sensing circuit is configured to determine a resistance of the first external resistor when the first external resistor is electrically connected to the first pin.

3. The IC of claim 2, wherein the impedance sensing circuit comprises a voltage forcing circuit and a current sensing circuit, wherein the voltage forcing circuit is configured to control a voltage of the first pin to a first controlled voltage level, and wherein the current sensing circuit is configured to measure a current through the first external resistor when the voltage of the first pin is controlled to the first controlled voltage level, and wherein the impedance sensing circuit is further configured to determine the resistance of the first external resistor based on the measured current.

4. The IC of claim 3, wherein the impedance sensing circuit is configured to determine the resistance of the first external resistor by comparing the measured current to a plurality of threshold signals.

5. The IC of claim 3, wherein the IC further comprises a second pin, and wherein the impedance sensing circuit further comprises a multiplexer configured to selectively connect the voltage forcing circuit to the first or second pins, and wherein the impedance sensing circuit is configured to determine a resistance of a second external resistor when the second external resistor is electrically connected to the second pin, and wherein the impedance sensing circuit is further configured to digitally configure the IC based on the determined resistance of the second external resistor.

6. The IC of claim 3, wherein the impedance sensing circuit comprises a current sinking transistor electrically connected to the first pin, and wherein the impedance sensing circuit further comprises a current sourcing transistor electrically connected to the first pin, and wherein the current sourcing transistor is configured to measure the current through the first external resistor when the first external resistor is electrically connected between the first pad and a first voltage, and wherein the current sinking transistor is configured to measure the current through the first external resistor when the first external resistor is electrically connected between the first pad and a second voltage.

7. The IC of claim 6, wherein the current sinking transistor is electrically connected between the first voltage and the first pin, and wherein the current sourcing transistor is electrically connected between the second voltage and the first pin.

8. The IC of claim 2, wherein the resistor has a resistance selected from a plurality of resistor values, wherein each of the plurality of resistor values corresponds to a different digital configuration code of the IC.

9. The IC of claim 2, wherein the impedance sensing circuit comprises a current forcing circuit and a voltage sensing circuit.

10. The IC of claim 9, wherein the impedance sensing circuit is configured to determine the resistance of the first external resistor by comparing the measured voltage to a plurality of threshold signals.

11. The IC of claim 9, wherein the IC further comprises a second pin, and wherein the impedance sensing circuit further comprises a multiplexer configured to selectively connect the current forcing circuit to the first or second pins, and wherein the impedance sensing circuit is configured to determine a resistance of a second external resistor when the second external resistor is electrically connected to the second pin, and wherein the impedance sensing circuit is further configured to digitally configure the IC based on the determined resistance of the second external resistor.

12. The IC of claim 1, wherein the first external passive network includes a first terminal electrically connected to the first pin and a second terminal electrically connected to a first reference voltage.

13. The IC of claim 12, wherein the impedance sensing circuit is further configured to determine a voltage level of the reference voltage, and wherein the impedance sensing circuit is further configured to digitally configure the IC based on the determined voltage level.

14. The IC of claim 1, wherein the impedance sensing circuit is further configured to determine when the first pin is electrically floating.

15. The IC of claim 1, further comprising a plurality of memory elements, wherein the impedance sensing circuit is configured to modify digital configuration data stored in the plurality of memory elements based on the determined impedance of the first external passive component.

16. A method of digitally configuring an integrated circuit (IC), the method comprising:
determining an impedance of a first external passive network using an impedance sensing circuit of the IC, wherein the first external passive network is electrically connected to a first pin of the IC, and wherein the first external passive network is disposed external to the IC; and
digitally configuring the IC to one of at least four possible states based on the determined impedance of the first external passive network.

17. The method of claim 16, wherein the first external passive network is electrically connected between a reference voltage and the pin.

18. The method of claim 17, wherein the method further comprises:
determining a voltage level of the reference voltage; and
digitally configuring the IC based on the determined voltage level.

19. The method of claim 16, further comprising using the first pin operationally after digitally configuring the IC, wherein using the first pin operationally comprises at least one of transmitting a signal from the IC using the first pin or receiving a signal into the IC using the first pin.

20. The method of claim 16, wherein the first external passive network includes a first external resistor, and wherein determining the impedance of the first external passive network comprises determining a resistance of the first external resistor.

21. The method of claim 20, wherein determining the resistance of the first external resistor comprises controlling a flow of current through the first external resistor to a first controlled current level and measuring a voltage across the first external resistor when the flow of current through the first external resistor is controlled to the first controlled current level.

22. The method of claim 20, wherein determining the resistance of the first external resistor comprises controlling a voltage of the first pin to a first controlled voltage level and measuring a current through the first external resistor when the first pin is controlled to the first controlled voltage level.

23. The method of claim 22, wherein determining the resistance of the first external resistor further comprises comparing the measured current to a plurality of threshold signals.

24. The method of claim 23, wherein generating the threshold signals comprises determining a resistance of a reference resistor, and generating the plurality of threshold signals based on the result.

25. The method of claim 24, further comprising digitally configuring the IC based on the resistance of the reference resistor.

26. The method of claim 24, wherein the reference resistor is electrically connected between a reference voltage and the pin, and wherein the method further comprises:
determining a voltage level of the reference voltage; and
digitally configuring the IC based on the determined voltage level.

* * * * *